United States Patent [19]
Tasaka

[11] Patent Number: 5,610,092
[45] Date of Patent: Mar. 11, 1997

[54] METHOD FOR FABRICATING LARGE CAPACITY NAND TYPE ROM WITH SHORT MEMORY CELL GATE LENGTH

[75] Inventor: Kazuhiro Tasaka, Tokyo, Japan

[73] Assignee: NEC Corporation, Tokyo, Japan

[21] Appl. No.: 644,272

[22] Filed: May 10, 1996

[30] Foreign Application Priority Data

May 12, 1995 [JP] Japan .................... 7-114322

[51] Int. Cl.$^6$ .................................. H01L 21/8246
[52] U.S. Cl. .................... 437/48; 437/44; 437/984
[58] Field of Search .................... 437/44, 45, 48, 437/238, 984

[56] References Cited

U.S. PATENT DOCUMENTS 4,565,712  1/1986  Noguchi et al. ............... 437/48
5,429,967  7/1995  Hong .......................... 437/48
5,470,774  11/1995 Kunitou ....................... 437/48
5,514,611  5/1996  Kim et al. .................... 437/44

Primary Examiner—Chandra Chaudhari
Attorney, Agent, or Firm—Foley & Lardner

[57] ABSTRACT

A NAND type mask ROM having a gate length of one half micron or below is disclosed. For the fabrication of this device, gate electrodes are formed on a gate insulating film which is on a P-type silicon substrate and in which a memory cell region and a peripheral transistor are separately defined by a field oxide film. Then, N$^-$-type diffusion layers are formed, and then an insulating layer is deposited by a biased ECRCVD process. The insulating film is not formed on edges of the memory cell gate electrodes so that, when the entire surface of the insulating film is etched-back, side walls are formed only in the peripheral transistor region. By subsequently forming N$^+$-type diffusion layers, N-channel cell transistors and an N-channel LDD transistor 11 are formed in a self-aligned form. The resulting structure permits increasing memory cell transistor "on" current without increasing the number of steps and number of masks.

7 Claims, 3 Drawing Sheets

METHOD FOR FABRICATING LARGE CAPACITY NAND TYPE ROM WITH SHORT MEMORY CELL GATE LENGTH

BACKGROUND OF THE INVENTION (1) Field of the Invention

The present invention relates to a method for fabricating a semiconductor device, and more particularly to a method for fabricating a large capacity NAND type mask ROM having a memory cell gate length of one half micron or below.

(2) Description of the Related Art

A prior art method for fabricating a NAND type mask ROM of the kind to which the present invention relates is first explained with reference to FIGS. 1A to 1C. As shown in FIG. 1A, on a P-type silicon substrate 1, a field oxide film 2 is formed by using a selective oxidization process. By the field oxide film 2, the substrate 1 is divided into a memory cell region 3 and a peripheral transistor region 4. A gate oxide film 5 is then formed, and then gate electrodes 6a to 6e having a polysilicon or polycide structure are formed. Then, N⁻-type diffusion layers 7a to 7g are formed by ion implantation with the gate electrodes 6a to 6e used as masks. Then, as shown in FIG. 1B, an insulating film 8 is deposited over the entire surface of the P-type silicon substrate 1. The insulating film 8 is deposited such that it has a substantially uniform thickness on the entire surface of the gate electrodes 6a to 6e.

Then, as shown in FIG. 1C, the entire surface of the insulating film 8 is etched-back by anisotropic dry etching to form side walls 9a to 9j of insulating film 8. Then, N⁺-type diffusion layers 10a to 10g are formed by ion implantation with the gate electrodes 6a to 6e and side walls 9a to 9j used as masks. Thus, N-channel LDD transistors 11a to 11e are formed in the memory cell region 3 and peripheral transistor region 4, thus completing a base structure of NAND type mask ROM. Where a CMOS circuit (not shown) is adopted, P-channel transistors are formed in the peripheral transistor region 4. Subsequently, data writing is performed by changing the desired transistors in the memory cell region 3 from enhancement type to depletion type by ion implantation. After a subsequent interconnection step, the NAND type mask ROM is completed.

With recent NAND type mask ROM integration density increase, each of the inter-gate electrode intervals between adjacent ones of the gate electrodes 6a to 6d in the memory cell region 3 is reduced to be one half micron or below. Since the side walls 9a to 9h are formed in such narrow spaces, the ion implantation is made incompletely. Therefore, the N⁺-type diffusion layers 10b to 10d are formed such that they have less junction depth compared to the N⁺-type junction layers 10a and 10e to 10g or, in an extreme case, fail to be formed. A problem that occurs in this connection is a decrease of "on" current in the N-channel enhancement type transistors 11a to 11d, which results in a lowering of the reliability and yield of the device.

SUMMARY OF THE INVENTION

An object of the invention, therefore, is to provide a method for fabricating a semiconductor device, which permits increasing the memory cell transistor "on" current without increasing the number of steps and number of masks in the fabrication.

According to one aspect of the invention, there is provided a method for fabricating a semiconductor device, comprising the steps of:

forming diffusion layers in a memory cell region and a peripheral transistor region that are separately defined on a semiconductor substrate;

depositing an insulating film on the diffusion layers; and etching-back the insulating film to remove the insulating film in the memory cell region while forming side walls from the insulating film in the peripheral transistor region, thereby forming an LDD transistor in the peripheral transistor region and cell transistors in the memory cell region in a self-aligned form.

According to the invention, the side walls are formed on the gate electrodes in the peripheral transistor region but are not formed on the gate electrodes in the memory cell region, and this makes it possible to increase the "on" current of the memory cell transistors without increasing the number of process steps.

According to the invention, after the formation of the N⁻-type diffusion layers, by the biased ECRCVD process, the insulating film is deposited and etched-back such that this insulating film is removed in the memory cell region but the side walls are formed from it in the peripheral transistor region. It is possible to form an LDD transistor in the peripheral transistor region and cell transistors in the memory cell region in a self-aligned form without an increase of neither the number of steps nor the number of masks. Thus, it is possible to increase the "on" current in NAND type memory cell transistors having a gate length of one half micron or below, thus improving the reliability and yield of the device.

BRIEF DESCRIPTION OF THE DRAWINGS

The above and other objects, features and advantages of the present invention will be apparent from the following description of preferred embodiments explained with reference to the accompanying drawings, in which.

PREFERRED EMBODIMENTS OF THE INVENTION

Now, preferred embodiments of the invention are described with reference to the drawings.

Figure 1A:
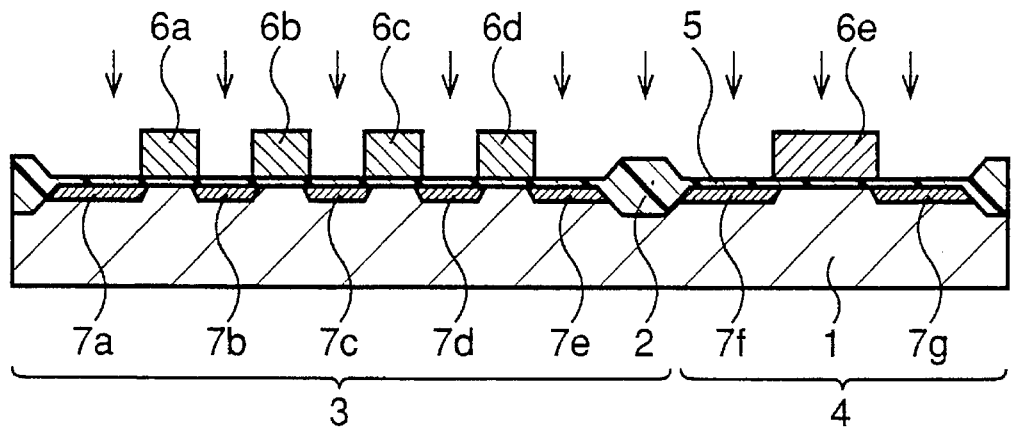
FIGS. 1A, 1B and 1C are sectional views illustrating sequential steps in a prior art method for fabricating a semiconductor memory.
Figure 1B:
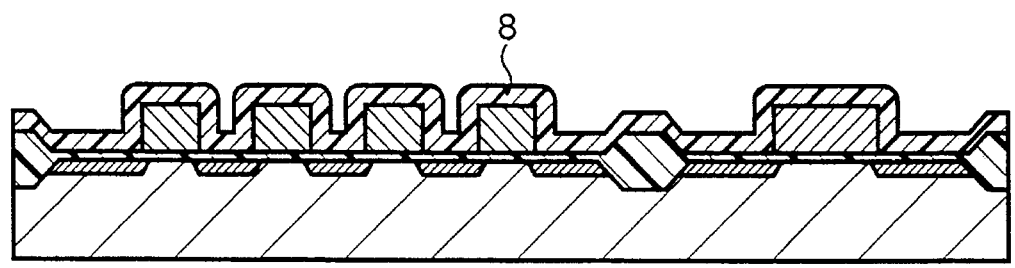
Figure 1C:
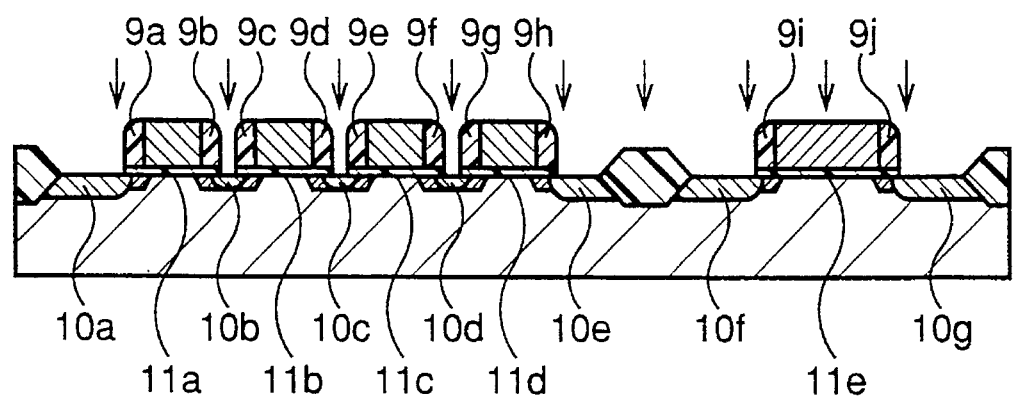
Figure 2A:
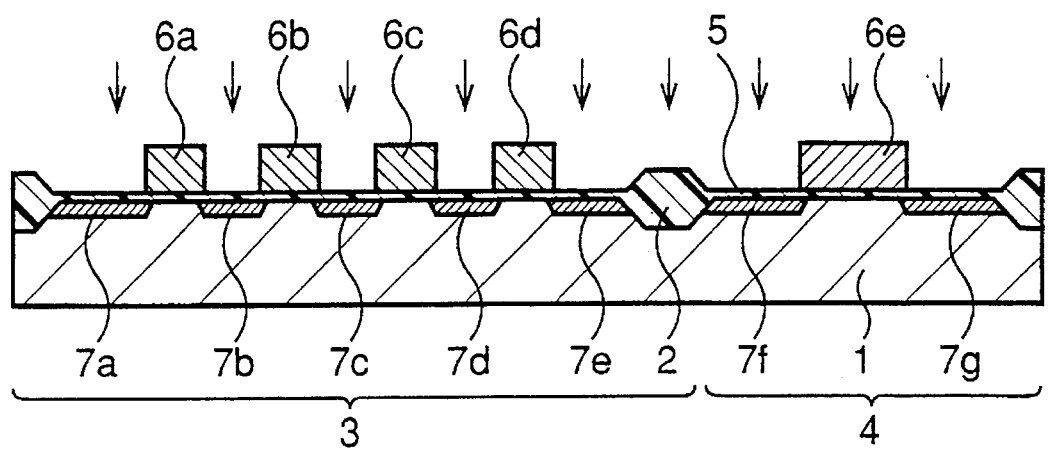
FIGS. 2A, 2B and 2C are sectional views illustrating sequential steps in a first embodiment of the method according to the invention.
Figure 2B:
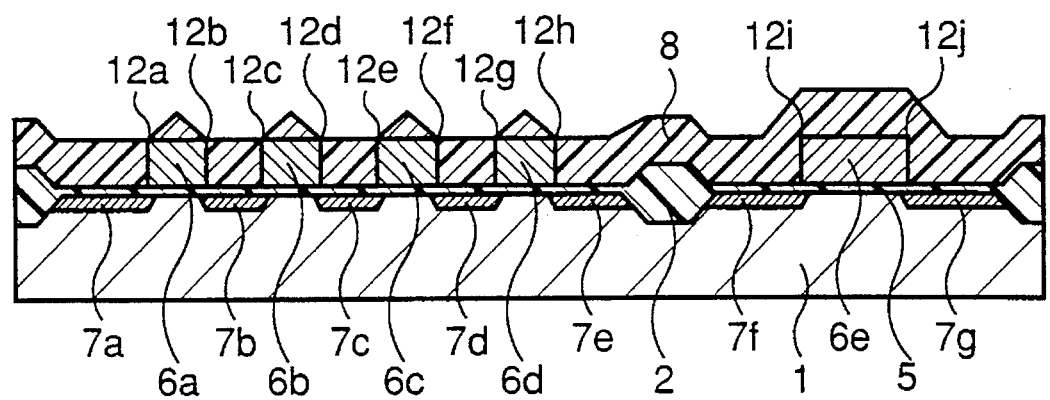
Figure 2C:
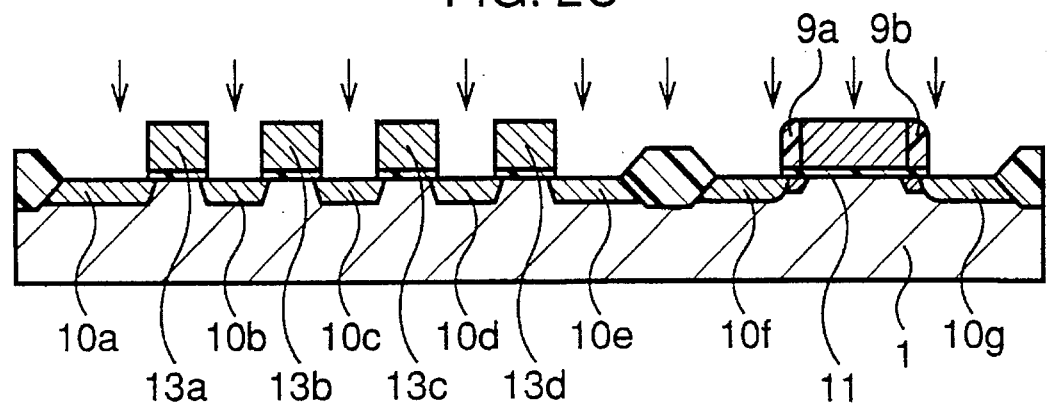

FIGS. 2A to 2C are referred to for explaining a first embodiment according to the invention.

As shown in the drawings, in the method for fabricating semiconductor device according to the invention, as a basic structure, diffusion layers are formed in a memory cell region and a peripheral transistor region defined separately on a semiconductor substrate, and then an insulating film is deposited and etched-back to remove the portion of it on the memory cell region while forming side walls from it on the peripheral transistor region, thereby forming an LDD transistor in the peripheral transistor region and cell transistors in the memory cell region in a self-aligned form.

A method for fabricating the semiconductor device according to the invention will now be described in detail. As shown in FIG. 2A, on a P-type silicon substrate 1, a field oxide film 2 having a thickness of 0.3 to 0.5 µm by a selective oxidization process, thus defining a memory cell region 3 and a peripheral transistor region 4 as separate regions on the substrate 1 by a field oxide film 2. A gate oxide film 5 having a thickness of 5 to 20 nm is then formed. Then, polysilicon is deposited and selectively etched using a photoresist mask to form polysilicon gate electrodes 6a to 6e. It is important to set the gate length of the gate electrodes 6a to 6d in the memory cell region 3 to 0.1 to 0.5 µm and optimize the inter-gate electrode distance and polysilicon film thickness such that the aspect ratio is unity or above. The gate length of the gate electrode 6e in the peripheral transistor region 4 is set to, for instance, 0.4 to 0.8 µm. In lieu of polysilicon as the material of the gate electrodes 6a to 6e, it is possible to use a double-layer structure of a high-melting metal (e.g., WSi, Mo, etc.) and polysilicon, i.e., polycide.

Then, using the gate electrodes 6a to 6e as masks, arsenic is ion implanted with acceleration energy of 30 to 50 keV and implantation dose of 1 to $5\times10^{13}$ $cm^{-2}$, thereby forming $N^-$-type diffusion layers 7a to 7g.

Then, as shown in FIG. 2B, an insulating film 8, of $SiO_2$ for instance, is formed over the entire surface of the P-type silicon substrate 1 using a biased ECRCVD (Electron Cyclotron Resonance Chemical Vapor Deposition) process. As for the conditions of film formation, in a long mean free path (of several meters), a gas such as $SiH_4$, Ar and $O_2$, under a pressure of 1 to several mTorr is used, the power is set to 100 to 500 W, and the film thickness is set to one half or above of the inter-electrode distance of the gate electrodes 6a to 6d. Under these conditions, the insulating film 8 is formed so as to bury the inter-gate electrode spaces 6a–6b, 6b–6c and 6c–6d in the memory cell region 3, but no insulating film 8 is deposited on the edges 12a to 12h of the gate electrodes 6a to 6d, whereas the insulating film 8 is deposited on the edges 12i and 12g of the gate electrode 6e in the peripheral transistor region 4. This is an important aspect of the invention.

Then, as shown in FIG. 2C, anisotropic dry etching is performed to leave side walls 9a and 9b of insulating film only in the peripheral transistor region 4. In the memory cell region 3, the insulating film 8 is removed. The ratio of selective etch-back between the insulating film 8 and the P-type silicon substrate 1 is preferably 30or above.

Subsequently, $N^+$-type diffusion layers 10a to 10g are formed by ion implantation of arsenic with the gate electrodes 6a to 6e and side walls 9a and 9b used as masks. Consequently, the ion concentration at the portions corresponding to the $N^-$-type diffusion layers 7a to 7g becomes high. In this way, it is possible to form an N-channel LDD enhancement type transistor in the peripheral transistor region 4 and N-channel cell transistors 13a to 13d in the memory cell region in a self-aligned form with an increase of neither the number of steps nor the number of masks.

The $N^+$-type diffusion layers 10b to 10d in the memory cell region 3 thus can be formed such that their junction depth is comparable to that of the $N^+$-type diffusion layers 10a and 10e to 10f, for instance 0.1 to 0.15 µm. In addition, the cell transistors in lieu of LDD permit an increase of cell transistor "on" current and thus result in an improvement in the reliability and yield of the device. The subsequent process is the same as in the prior art, so that it will not be described.

Figure 3A:
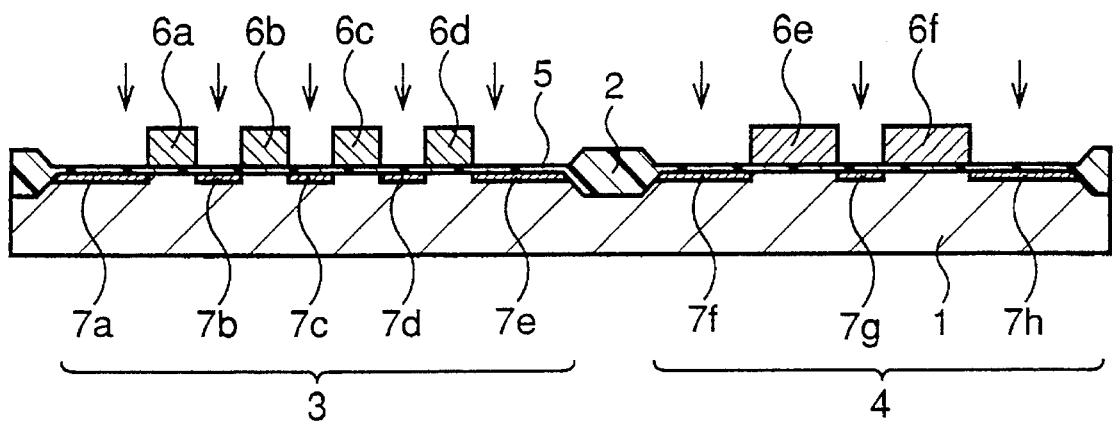
FIGS. 3A, 3B and 3C are sectional views illustrating sequential steps in a second embodiment of the method according to the invention.
Figure 3B:
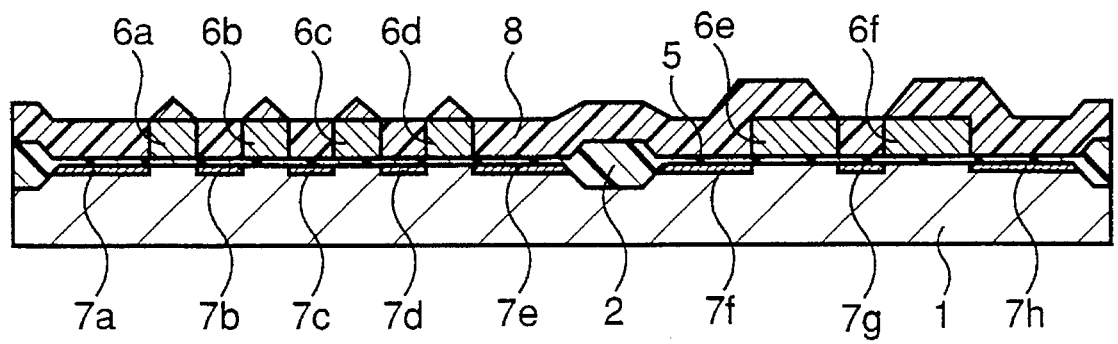
Figure 3C:
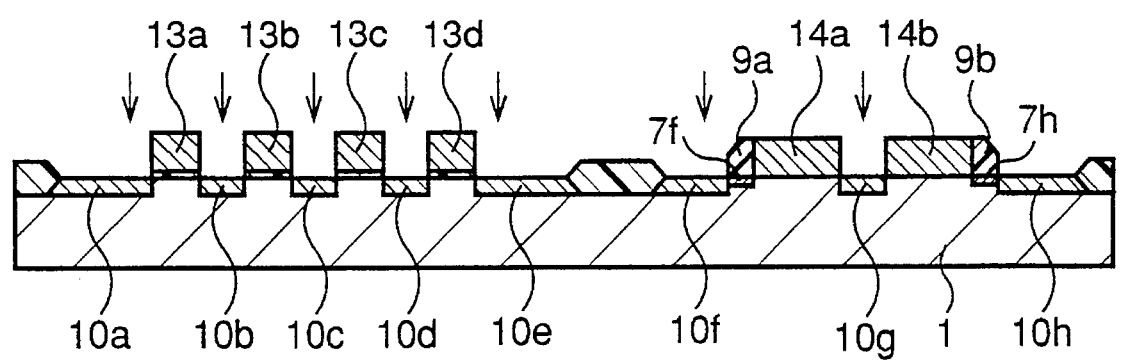

A second embodiment of the invention will now be described with reference to FIGS. 3A to 3C.

This embodiment is different from the first embodiment in that the inter-gate distance between gate electrodes 6e and 6f in peripheral transistor region 4 is made the same as the inter-gate distance in memory cell region 3.

In this embodiment, no side wall of insulating film is formed on the opposed end faces of the gate electrodes 6e and 6f in the peripheral transistor region 4, but side walls 9a and 9b are formed only on the other end faces than the opposed ones. Using the gate electrodes 6e and 6f and side walls 9a and 9b in the peripheral transistor region 4 as masks, arsenic is ion implanted, thus forming $N^+$-type diffusion layers 10g and 10h. Thus, single side LDD transistors 14a and 14b are formed in the peripheral transistor region 4. In addition, the resistivity of the $N^+$-type diffusion layer 10g can be reduced compared to the $N^-$-type diffusion layers 7f and 7g. Thus, when the $N^+$-type diffusion layers 10f and 10h are made as drain and the $N^+$-type diffusion layer 10g as source in this circuit structure, it is possible to increase the "on" current in the peripheral transistor region 4 as well as the "on" current in the memory cell transistors 13a to 13d.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a semiconductor device, comprising the steps of:

forming diffusion layers in a memory cell region and a peripheral transistor region that are separately defined on a semiconductor substrate;

depositing an insulating film on said diffusion layers; and etching-back said insulating film to remove said insulating film in said memory cell region while forming side walls from said insulating film in said peripheral transistor region, thereby forming an LDD transistor in said peripheral transistor region and cell transistors in said memory cell region in a self-aligned form.

2. The method for fabricating a semiconductor device according to claim 1, wherein said diffusion layers are of the opposite conductivity type to said semiconductor substrate.

3. A method for fabricating a semiconductor device, comprising the steps of:

forming gate electrodes over a semiconductor substrate in which a memory cell region and a peripheral transistor region are separately defined by an isolation field oxide film, said gate electrodes being formed on a gate insulating film formed on said semiconductor substrate;

ion-implanting, as a first ion implantation step, first ions of a conductivity type opposite to that of said semiconductor substrate with said gate electrodes used as masks;

forming an insulating film by completely burying inter-gate electrode spaces between adjacent ones of said gate electrodes in said memory cell region without allowing said insulating film to be deposited on edges of said gate electrodes, and providing said insulating film on an entire surface of said gate electrodes in said peripheral transistor region;

forming side walls by anisotropically etching-back said insulating film and removing said insulating film in said inter-gate electrode spaces between adjacent ones of said gate electrodes in said memory cell region, while forming side walls on a gate electrode in said peripheral transistor region; and ion-implanting, as a second ion implantation step, second ions of a conductivity type opposite to that of said semiconductor substrate with said gate electrodes and said side walls used as masks.

4. A method for fabricating a semiconductor device, comprising the steps of:

forming gate electrodes over a semiconductor substrate in which a memory cell region and a peripheral transistor region are separately defined by an isolation field oxide film, said gate electrodes being formed on a gate insulating film formed on said semiconductor substrate;

ion-implanting, as a first ion implantation step, first ions of a conductivity type opposite to that of said semiconductor substrate with said gate electrodes used as masks;

forming an insulating film by burying inter-gate electrode spaces between adjacent ones of said gate electrodes in said memory cell region without allowing said insulating film to be deposited on edges of said gate electrodes, and providing said insulating film in said inter-gate electrode spaces in said peripheral transistor region without allowing said insulating film to be deposited on one of edges of each gate electrode in said peripheral transistor region;

forming side walls by anisotropically etching-back said insulating film and removing said insulating film in said inter-gate electrode spaces between adjacent ones of said gate electrodes in said memory cell region and said peripheral transistor region, while forming a side wall on said one of edges of each gate electrode in said peripheral transistor region; and ion-implanting, as a second ion implantation step, second ions of a conductivity type opposite to that of said semiconductor substrate with said gate electrodes and said side walls used as masks.

5. The method for fabricating a semiconductor device according to claim 1, wherein said insulating film is formed by a biased ECRCVD process.

6. The method for fabricating a semiconductor device according to claim 3, wherein said insulating film is formed by a biased ECRCVD process.

7. The method for fabricating a semiconductor device according to claim 4, wherein said insulating film is formed by a biased ECRCVD process.

\* \* \* \* \*